(12) United States Patent
Alberti et al.

(10) Patent No.: US 10,871,462 B2
(45) Date of Patent: Dec. 22, 2020

(54) MOX-BASED GAS SENSOR AND MANUFACTURING METHOD THEREOF

(71) Applicant: STMICROELECTRONICS S.R.L., Agrate Brianza (IT)

(72) Inventors: Alessandra Alberti, Gravina di Catania (IT); Lucio Renna, Acireale (IT); Leonardo Gervasi, San Giovanni la Punta (IT); Emanuele Smecca, Gela (IT); Salvatore Sanzaro, Sortino (IT); Clelia Carmen Galati, San Gregorio di Catania (IT); Antonello Santangelo, Belpasso (IT); Antonino La Magna, Scordia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 240 days.

(21) Appl. No.: 16/171,151

(22) Filed: Oct. 25, 2018

(65) Prior Publication Data

US 2019/0128830 A1 May 2, 2019

(30) Foreign Application Priority Data

Oct. 27, 2017 (IT) .................... 102017000122764

(51) Int. Cl.
| | |
|---|---|
| *G01N 27/12* | (2006.01) |
| *B81B 3/00* | (2006.01) |
| *B81C 1/00* | (2006.01) |

(52) U.S. Cl.
CPC ......... *G01N 27/127* (2013.01); *B81B 3/0089* (2013.01); *B81C 1/00714* (2013.01);
(Continued)

(58) Field of Classification Search
CPC ............... G01N 27/125; G01N 27/127; B81C 1/00714; B81C 2201/013;
(Continued)

(56) References Cited

U.S. PATENT DOCUMENTS

| | | | | |
|---|---|---|---|---|
| 5,876,787 A | * | 3/1999 | Avarbz | H01G 9/155 427/122 |
| 6,110,335 A | * | 8/2000 | Avarbz | H01G 11/34 204/294 |

(Continued)

OTHER PUBLICATIONS

Alberti et al., "Anatase/Rutile nucleation and growth on (0002) and (11-20) oriented ZnO:Al/glass substrates at 150° C.," *Thin Solid Films* 555:3-8, 2014.

(Continued)

*Primary Examiner* — Francis C Gray
(74) *Attorney, Agent, or Firm* — Seed IP Law Group LLP

(57) ABSTRACT

Gas sensor, comprising: a substrate of semiconductor material; a first working electrode on the substrate; a second working electrode on the substrate, at a distance from the first working electrode; an interconnection layer extending in electrical contact with the first and the second working electrode, configured to change its conductivity when reacting with gas species to be detected. The interconnection layer is of titanium oxide, has a porosity between 40% and 60% in volume and is formed by a plurality of meso-pores having at least one dimension in the range 6-30 nm connected to nano-pores having at least one respective dimension in the range 1-5 nm.

26 Claims, 8 Drawing Sheets

(52) U.S. Cl.
CPC .... *G01N 27/125* (2013.01); *B81B 2201/0214* (2013.01); *B81B 2203/0127* (2013.01); *B81B 2203/0315* (2013.01); *B81B 2203/0353* (2013.01); *B81B 2203/04* (2013.01); *B81C 2201/013* (2013.01); *B81C 2201/0178* (2013.01); *B81C 2201/0181* (2013.01)

(58) Field of Classification Search
CPC .... B81C 2201/0178; B81C 2201/0181; B81B 2201/0214; B81B 2203/0127; B81B 2203/0315; B81B 2203/0353; B81B 2203/04; B81B 3/0089
See application file for complete search history.

(56) References Cited

U.S. PATENT DOCUMENTS

| | | | | |
|---|---|---|---|---|
| 6,838,054 | B1* | 1/2005 | Durrant | G01N 33/5438 |
| | | | | 204/403.01 |
| 7,772,700 | B2* | 8/2010 | Tanaka | H01L 23/564 |
| | | | | 257/758 |
| 2007/0261959 | A1* | 11/2007 | Kim | G01N 27/127 |
| | | | | 204/424 |
| 2010/0285972 | A1* | 11/2010 | Dubrow | B82Y 30/00 |
| | | | | 506/7 |
| 2015/0024248 | A1* | 1/2015 | He | H01M 10/0568 |
| | | | | 429/144 |
| 2015/0137836 | A1 | 5/2015 | Kim et al. | |
| 2018/0215628 | A1* | 8/2018 | Lee | C01B 13/34 |

OTHER PUBLICATIONS

Alberti et al., "Efficiency Enhancement in ZnO:Al-Based Dye-Sensitized Solar Cells Structured with Sputtered $TiO_2$ Blocking Layers," *The Journal of Physical Chemistry C* 188:6576-6584, 2014.

Alvarez et al., "Nanostructured Ti thin films by magnetron sputtering at oblique angles," *Journal of Physics D: Applied Physics* 49: 2016, 10 pages.

Álvarez et al., "Theoretical and experimental characterization of $TiO_2$ thin films deposited at oblique angles," *Journal of Applied Physics D: Applied Physics* 44(38): 2011, 19 pages.

Chen et al., "Acetone sensing performances based on nanoporous $TiO_2$ synthesized by a facile hydrothermal method," *Sensors and Actuators B* 238:491-500, 2017.

Chen et al., "Anisotropic $Ti_xSn_{1-x}O_2$ nanostructures prepared by magnetron sputter deposition," *Nanoscale Research Letters* 6:326-330, 2011.

Dwivedi et al., "Scalable fabrication of prototype sensor for selective and sub-ppm level ethanol sensing based on $TiO_2$ nanotubes decorated porous silicon," *Sensors and Actuators B* 249:602-610, 2017.

Feng et al., "Contact-controlled sensing properties of flowerlike ZnO nanostructures," *Applied Physics Letters* 87: 2005, 3 pages.

Ge, "A Review of One-dimensional $TiO_2$ Nanostructured Materials for Environmental and Energy Applications," *Journal of Materials Chemistry A* 4(18):6772-6801, 2016 (27 pages).

Gómez et al., "High efficiency dye-sensitized nanocrystalline solar cells based on sputter deposited Ti oxide films," *Solar Energy Materials & Solar Cells* 64:385-392, 2000.

González-Garcia et al., "Aligned $TiO_2$ nanocolumnar layers prepared by PVD-GLAD for transparent dye sensitized solar cells," *Energy Envoron. Sci.* 4(9):3426-3435, 2011 (11 pages).

Hanaor et al., "Review of the anatase to rutile phase transformation," *J Mater Sci* 46:855-874, 2011.

Hazra et al., "Tailoring of the Gas Sensing Performance of $TiO_2$ Nanotubes by 1-D Vertical Electron Transport Technique," *IEEE Transactions on Electron Devices* 61(10):3483-3489, 2014.

Hemmati et al., "Nanostructured $SnO_2$—ZnO sensors: Highly sensitive and selective to ethanol," *Sensors and Actuators B* 160:1298-1303, 2011.

Kang et al., "Columnar rutile $TiO_2$ based dye-sensitized solar cells by radio-frequency magnetron sputtering," *Journal of Power Sources* 184:331-335, 2008.

Karunagaran et al., "$TiO_2$ thin film gas sensor for monitoring ammonia," *Materials Characterization* 58:650-684, 2007.

Kwon et al., "Enhanced ethanol sensing properties of $TiO_2$ nanotube sensors," *Sensors and Actuators B* 173:441-446, 2012.

Lee et al., "Temperature modulation in semiconductor gas sensing," *Sensors and Actuators B* 60:35-42, 1999.

Li et al., "Enhanced blue-green emission and ethanol sensing of Co-doped ZnO nanocrystals prepared by a solvothermal route," *Applied Physics A* 98:537-542, 2010.

Li et al., "Enhancement of the photocatalytic property of $TiO_2$ columnar nanostructured films by changing deposition angle," *Materials Research Bulletin* 50:68-72, 2014.

Ma et al., "Titanium Dioxide-Based Nanomaterials for Photocatalytic Fuel Generations," *Chemical Reviews* 114:9987-10043, 2014.

Motemani et al., "Adherence of human mesenchymal stem cells on Ti and $TiO_2$ nano-columnar surfaces fabricated by glancing angle sputter deposition," *Applied Surface Science* 292:626-631, 2014.

Park et al., "Enhanced ethanol sensing properties of $TiO_2$/ZnO core-shell nanorod sensors," 2014 *Applied Physics A* 115:1223-1229, 2014.

Pellegrino et al., "Fiber texturing in nano-crystalline $TiO_2$ thin films deposited at 150° C. by dc-reactive sputtering on fiber-textured [0001] ZnO: Al substrates," *Journal of Physics D* 45: 2012, 6 pages.

Pihosh et al., "Photocatalytic Properties of $TiO_2$ Nanostructures Fabricated by Means of Glancing Angle Deposition and Anodization," *Journal of the Electrochemical Society* 156(9):K160-K165, 2009.

Priyanka et al., "High-performance ethanol gas sensor using $TiO_2$ nanostructures" *The European Physical Journal Plus* 132:306-312, 2017.

Ren et al., "Study on the Porosity of $TiO_2$ Films Prepared by Using Magnetron Sputtering Deposition," *Journal of the Korean Physical Society* 58(4):883-885, 2011.

Richards et al., "Highly Porous Nanocluster $TiO_2$ Films Deposited Using APCVD in an Excess of Water Vapor," *Journal of the Electrochemical Society* 152(7):F71-F74, 2005.

Sanzaro et al., "Controlled $Al^{3+}$ Incorporation in the ZnO Lattice at 188° C. by Soft Reactive Co-Sputtering for Transparent Conductive Oxides," *Energies* 9:433-445, 2016.

Sanzaro et al., "Multi-Scale-Porosity $TiO_2$ scaffolds grown by innovative sputtering methods for high throughput hybrid photovoltaics," *Scientific Reports* 6: 2016, 15 pages.

Thornton et al., "The microstructure of sputter-deposited coatings," *The Journal of Vacuum Science and Technology A* 4(6):3059-3065, 1986.

Tommasi et al., "Modeling, Fabrication and Testing of a Customizable Micromachined Hotplate for Sensor Applications," *Sensors* 17(62): 2017, 18 pages.

Wang et al., "A high-response ethanol gas sensor based on one-dimensional $TiO_2/V_2O_5$ branched nanoheterostructures," *Nanotechnology* 27:2016, 12 pages.

Wang et al., "The gas sensing properties of $TiO_2$ nanotubes synthesized by hydrothermal method," *Chinese Chemical Letters* 22:603-606, 2011.

Zhou et al., "A Simple Model to Describe the Rule of Glancing Angle Deposition," *Materials Transactions* 52(3):469-473, 2011.

* cited by examiner

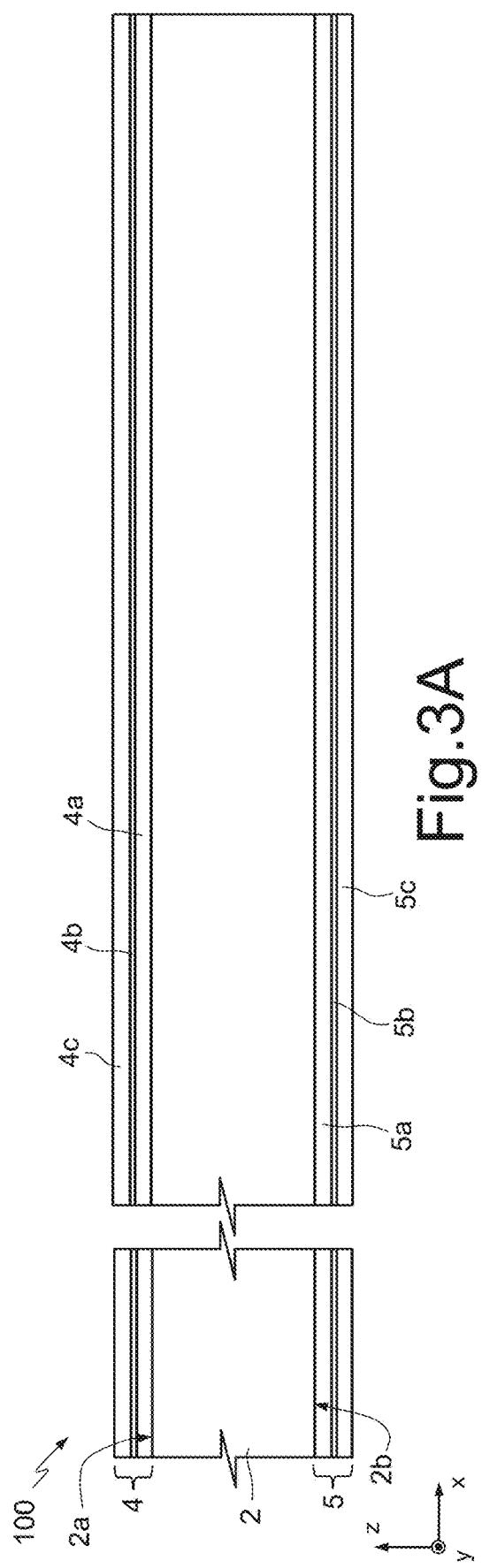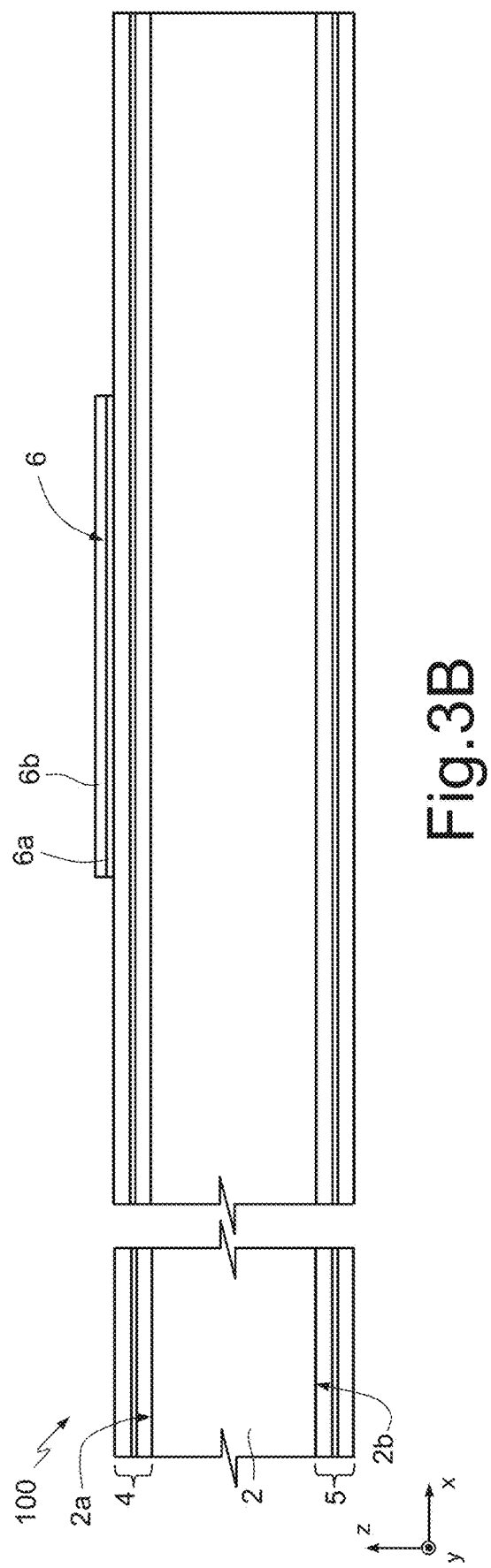

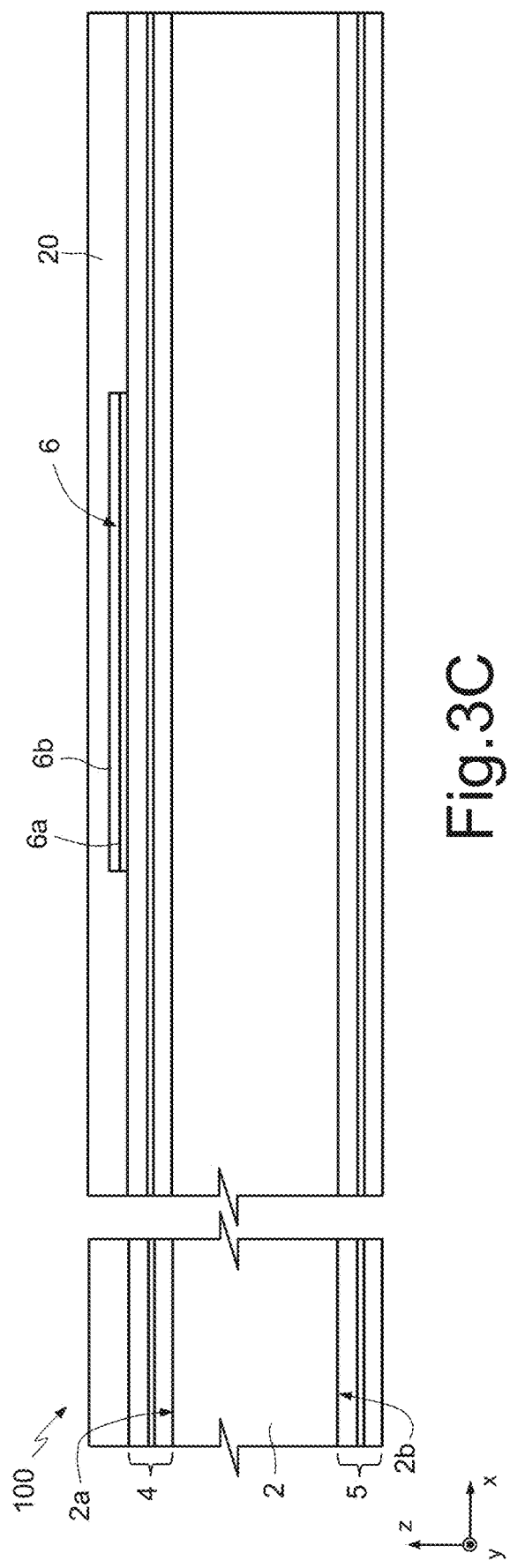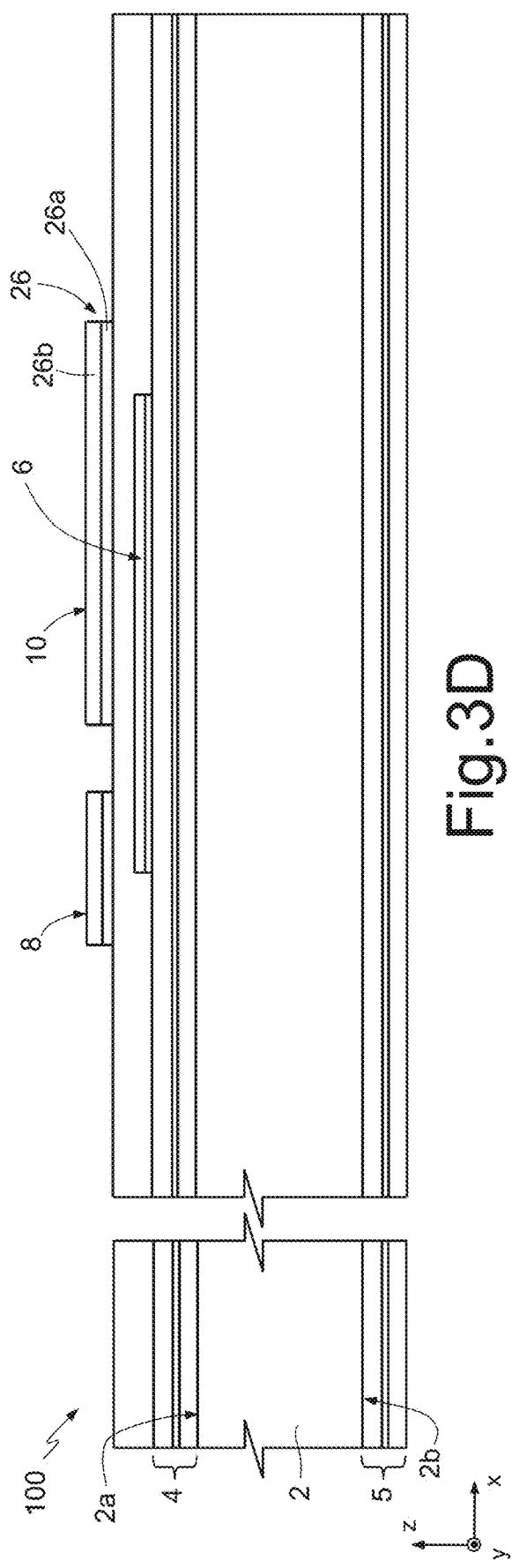

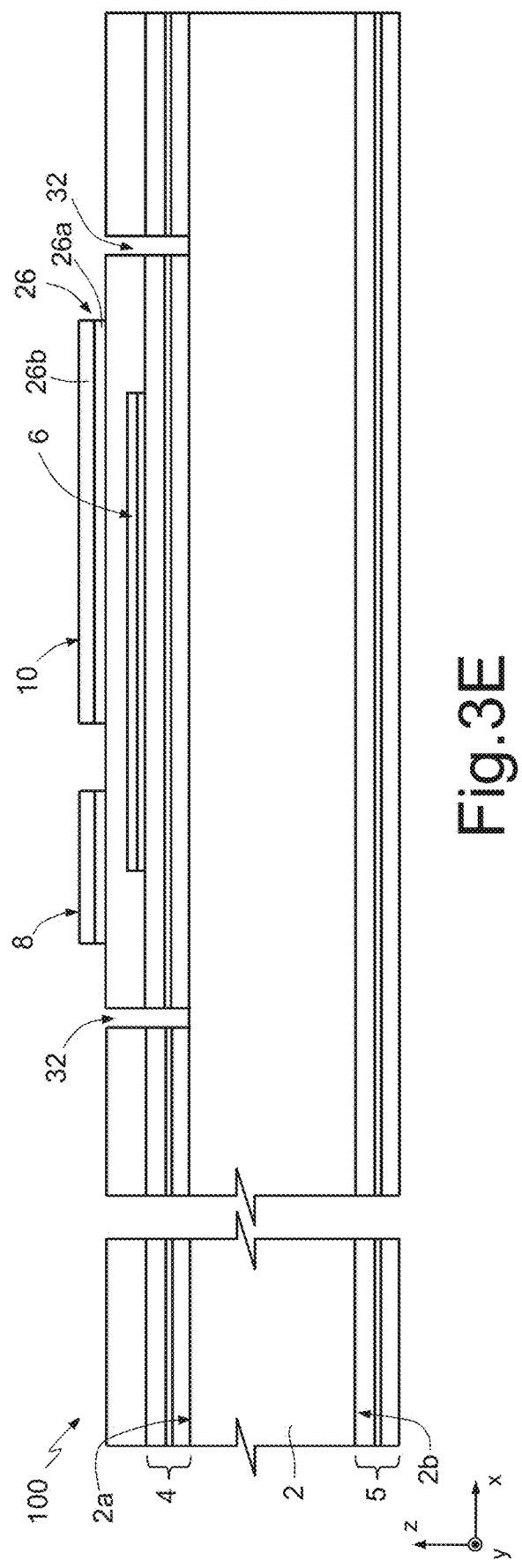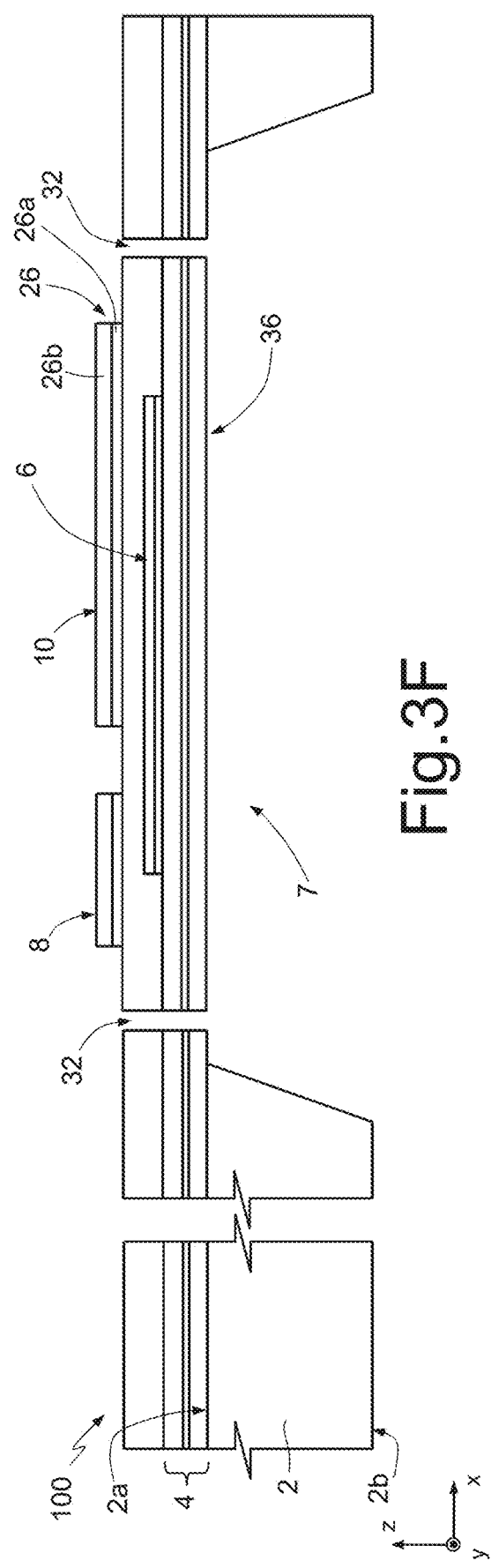

MOX-BASED GAS SENSOR AND MANUFACTURING METHOD THEREOF

BACKGROUND

Technical Field

The present disclosure relates to a gas sensor and a method for manufacturing the gas sensor; in particular the present disclosure relates to a micromachined, MOx-based, gas sensor having a sponge-like titanium oxide sensing layer.

Description of the Related Art

Gas sensors for environmental air quality control are becoming more and more important both in terms of technological development and business. The need for improving the response of gas-sensing materials and the continuous development of micro-machining techniques are fostering the miniaturization of chemical sensors. In wearable and consumer applications, resistance-type sensors are prevailing for their reduced cost, size and power consumption.

Nowadays, commonly commercialized chemical sensors use a sensing layer based on a thick metal oxide, since a sensing layer of this type provides stable response and is highly performing; however, when power consumption is an issue, a thin film is desirable. The manufacturing process of such a film should guarantee a controllable and reproducible morphology, both in terms of uniformity and surface reactivity.

Titanium dioxide ($TiO_2$) is a well-known gas-sensing material and, in the recent past, nanostructured $TiO_2$-based sensing layers have been evaluated for their high sensing performance. A high sensitivity is, in general related to a high surface-to-volume ratio as well as to a high surface activity.

Y. Kwon et al. reported, in the publication titled "Sensors and Actuators B: Chemical Enhanced Ethanol Sensing Properties of $TiO_2$ Nanotube Sensors", Sensors Actuators B. Chem. 173 (2012), pp. 441-446, that $TiO_2$ nanotubes are sensitive to ethanol, even under ambient condition. However, an unstable response was showed to low ethanol concentration (<100 ppm).

High sensitivity at low operating temperature (<150° C.) has been reported for an aligned $TiO_2$ nanotube synthesized by an electrochemical anodization technique by A. Hazra et al., "Tailoring of the Gas Sensing Performance of $TiO_2$ Nanotubes by 1-D Vertical Electron", 61 (2014), pp. 3483-3489. In that case, a post-processing annealing in controlled atmosphere, at 300° C. for two hours, was applied for sensing optimization.

For commercial resistive-type gas sensors, a direct deposition on the active area of the device, likely by a single production step, is desired to integrate the sensing material. Up-scalable deposition approaches are therefore recommended to guarantee high production throughput, as in the case of sputtering-based techniques.

Several attempts were done in the known art in order to grow porous $TiO_2$ layers by physical approaches, mainly applying a model proposed by J. A. Thornton in "The microstructure of sputter-deposited coatings", J. Vac. Sci. Technol. A 4, 1986, pp. 3059-3065. To overcome the porosity limit of this approach, cauliflower, penniform or zig-zag structures were also created.

Glancing angle deposition methods (GLAD) were used to deposit Ti nanostructures by ex-situ oxidation. See for example Z. Li et al., "Enhancement of the photocatalytic property of $TiO_2$ columnar nanostructured films by changing deposition angle", Materials Research Bulletin, 50 (2014), pp. 68-72. See also Y. Motemani et al., "Adherence of human mesenchymal stem cells on Ti and $TiO_2$ nano-columnar surfaces fabricated by glancing angle sputter deposition", Appl. Surf. Sci., 292 (2014), pp. 626-631.

Further authors suggest to form Ti nanostructures by templating materials (e.g., polystyrene nano-spheres), exploiting their shadowing effect during $TiO_2$ growth.

The aforementioned processes often require more than one process step, or are not compatible with the architecture of a sensing device.

BRIEF SUMMARY

In one or more embodiments of the present disclosure, specific attention is paid to the structure of the sensor device (heating element, interdigitated electrical conducts, passivation layers, etc.) and related manufacturing methods, in order to improve reliability and stability of the sensor. To comply with the desires of structural integrity and high performances, deposition at room temperature and the absence of any thermal budgets for sintering/reaction of the sensing material is desirable and highly appealing for industries.

One or more embodiments of the present disclosure provide a gas sensor and a manufacturing method thereof, that overcome problems and issues previously illustrated.

According to the present disclosure, a gas sensor and a manufacturing method thereof are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 3A-3H graphically show manufacturing steps of the gas sensor of FIG. 1;

DETAILED DESCRIPTION

Figure 1:
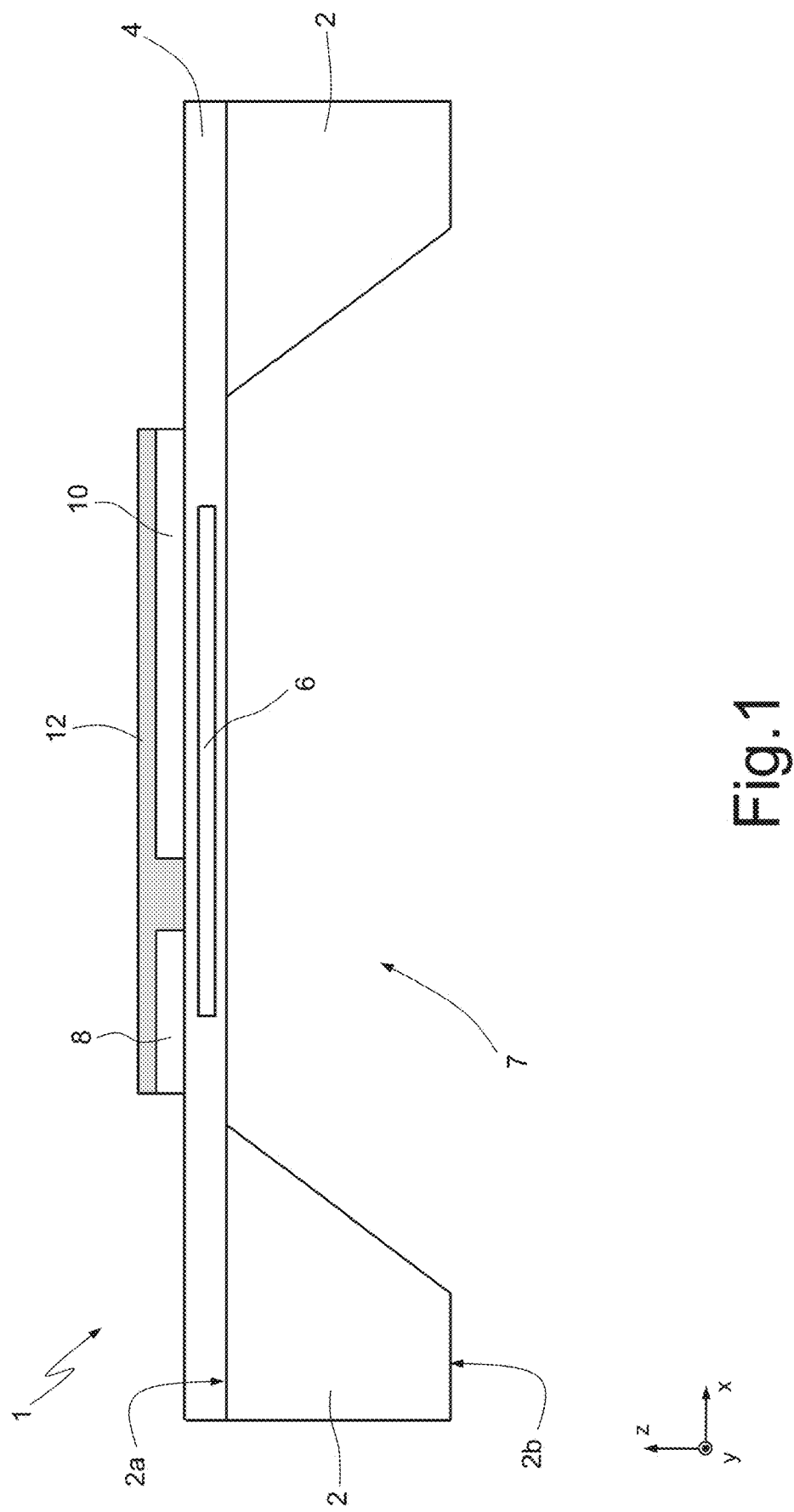
FIG. 1 is a cross-sectional view of a gas sensor according to an embodiment of the present disclosure.
Figure 2:
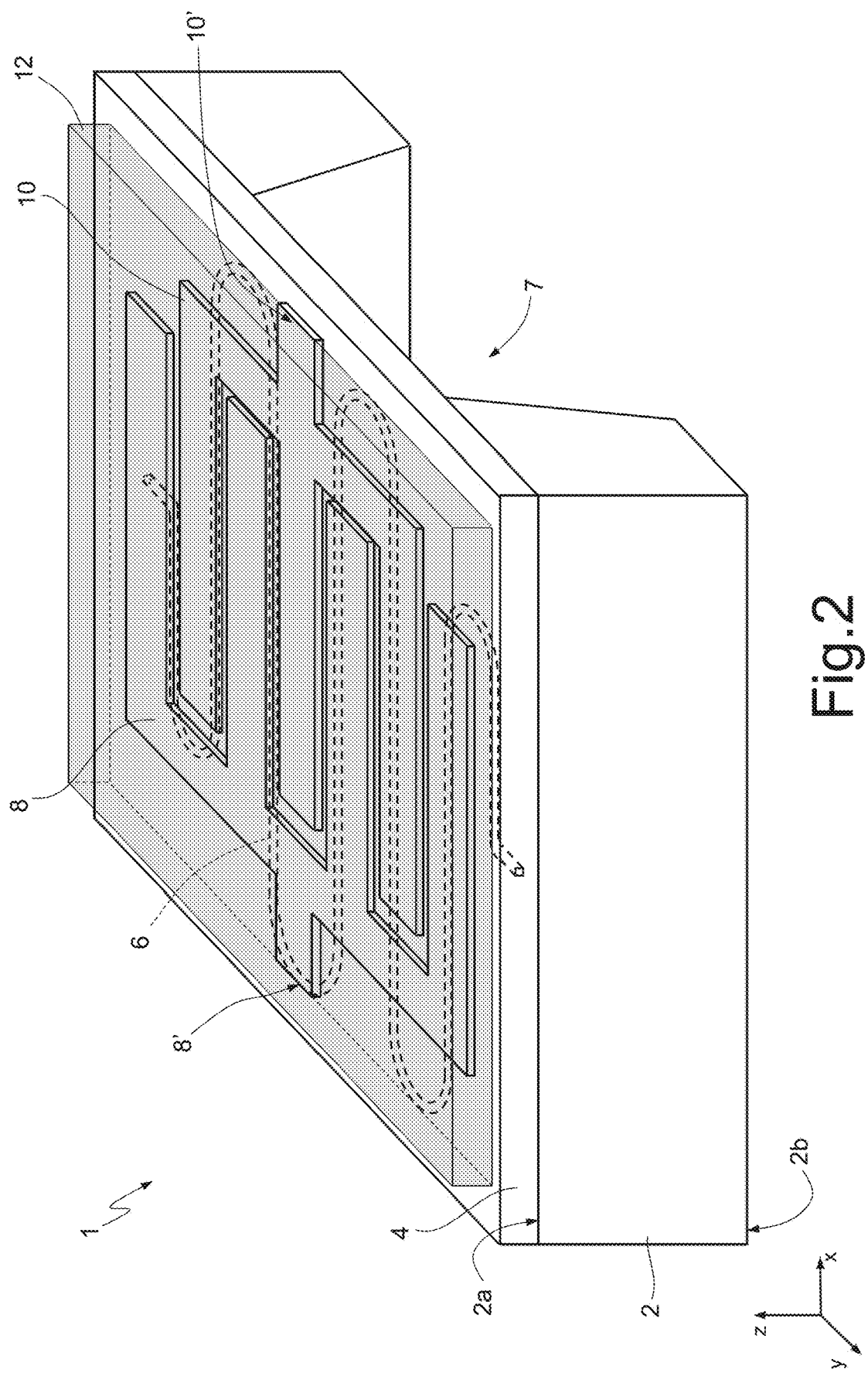
FIG. 2 is a perspective view of the gas sensor of FIG. 1.

FIG. 1 shows, in a section view and in a triaxial system of orthogonal axis X, Y, Z, a gas sensor 1 according to an embodiment of the present disclosure. FIG. 2 shows the gas sensor 1 in a perspective view.

The gas sensor 1 includes a substrate 2, e.g., of semiconductor material such as silicon, having a front side 2a and a back side 2b; an electrical-insulation layer 4, over the front side 2a of the substrate 2, e.g., of silicon dioxide, silicon nitride, or tetraethyl orthosilicate (TEOS); a heater 6, buried in the electrical-insulation layer 4, of a conductive material (e.g., a layer or a multilayer of titanium and/or platinum) and configured to generate heat by Joule effect; a first and a second comb-finger electrode 8, 10, of conductive material (e.g., a layer or a multilayer of titanium and/or platinum), arranged on the electrical-insulation layer 4 in an interdigitated arrangement; and an active layer 12 extending on the first and the second comb-finger electrode 8, 10 and/or in the spaces between adjacent fingers of the first and the second comb-finger electrode 8, 10. The active layer 12 is of metal-oxide (MOx) material, in particular titanium oxide ($TiO_2$) and is configured to detect, or sense, the presence of a gaseous substance/gaseous species in a working environment. In an embodiment of the present disclosure, the sensing takes place in specific thermal conditions as detailed later on. In particular, the active layer 12 extends in direct contact with the fingers of both the first and second comb-finger electrode 8, 10 to electrically connect the first comb-finger electrode 8 to the second comb-finger electrode 10 (and vice versa).

With reference to FIG. 2, the spacing, along Y axis, between a finger of the first comb-finger electrode 8 and an adjacent finger of the second comb-finger electrode 10 is for example in the range 1-10 μm, more in particular 3-5 μm.

The electrical-insulation layer 4 forms, in part, a membrane suspended over a cavity 7 etched in the substrate 2 in such a way that also the first and second comb-finger electrodes 8, 10, the heater 6 and the active layer 12 are at least partially suspended over the cavity 7.

In the embodiment of FIGS. 1, 2, the gas sensor 1 is of a resistive type. A resistive gas sensor depends upon a flow of current through the active layer 12 for an analytical measure to be made. As the active layer 12 reacts to the presence of an analyte (gas) present in an environment, the conductivity of the active layer 12 changes. As a result, the measured resistance through a length of the active layer 12 also changes. The resistance of a resistive sensor changes as the sensor is exposed to different concentrations of analyte. As the active layer 12 reacts to the presence of an analyte by increasing or decreasing its conductivity, the resistance between the two interdigitated electrodes 8, 10 will correspondingly decrease or increase. Accordingly, by measuring the resistance change between electrical terminals 8' and 10' of the first and, respectively, the second comb-finger electrode 8, 10, a gas sensing operation can be performed.

According to an aspect of the present disclosure, the active layer 12 is of $TiO_2$, has a thickness, along Z axis, between 200 and 1000 nm, in particular between 200 and 400 nm, more in particular 350 nm, and a porosity between 40% and 60% of the volume, in particular 50% in volume.

The applicant verified that the active layer 12 has a sponge-like structure, formed by rods separated by meso-pores; the rods, on their side, have an internal structure formed by an interconnected network of nano-pores. The meso-pores are fluidically connected to an external environment where gas species to be sensed are present and are further fluidically connected to the nano-pores (see FIG. 6 and related description). Such layer can be used for sensing applications by exploiting its double-scale porosity, so that the meso-pores behave as preferred ports for the gas species to enter the whole thickness of the active layer 12 and deeply imbue the network of nanopores. This enhances the probability of surface interaction between the gas species to be revealed and the active layer 12.

During sensing operations, the heater 6 is driven to maintain a temperatures (e.g., in the range 100-500° C.) to permit maximum sensitivity, in a per se known way.

The electrical response, in terms of device resistance, has been evaluated by the applicant at 300° C. using ethanol as a gas target in concentration of 44 ppm as a starting trial. An interaction is present between the active layer 12 and the gas species, based on the well-established surface-depletion model (see for example K. P. Priyanka, et al., "High-performance ethanol gas sensor using TiO2 nanostructures", Eur. Phys. J. Plus 132, 2017, p. 306 (1:7)). Before reacting with the gas species, the $TiO_2$ surfaces underwent an oxidation step, by adsorbing oxygen atoms from the atmosphere. The oxygen atoms take electrons away from the $TiO_2$ surface and, accordingly, locally generate electron-depleted regions. The depletion regions occupy most of the branched volume. As a reducing gas (e.g., ethyl alcohol) comes in contact with the modified $TiO_2$ surfaces (depleted regions), the gas tends to react with the adsorbed oxygen species. In the process, creating $CO_2$ and $H_2O$ species, electrons (6 per $CH_3CH_2OH$ molecule) are finally injected into the conduction band of $TiO_2$. This causes the resistance of the active layer 12 to decrease. The response, in terms of resistance decrease, consequently depends on the concentration of the gas species.

The gas sensor 1 may be used to sense volatile organic compounds (VOC), such as $NH_3$, $H_2O$, CO, $H_2$, $SO_2$, $NO_2$, $CH_2O$. An adequate treated surface may be present to expand the range of possible applications.

FIGS. 3A-3H show process steps to manufacture the gas sensor 1 of FIGS. 1, 2.

With reference to FIG. 3A, it is provided a wafer 100 including the substrate 2 having the front side 2a and the back side 2b, and a thickness, measured from the front side 2a to the back side 2b, of about 400-600 μm. The electrical-insulation layer 4 is formed on the front side 2a and, optionally, an electrical-insulation layer 5 is also formed on the back side 2b. The electrical-insulation layers 4 and 5 are each in the form of a multilayer or stack (in particular, a tri-layer of oxide, silicon nitride and TEOS). In detail, a thermal oxidation of the front sides 2a of the substrate 2 is carried out to grow a thermal oxide layer 4a having a thickness comprised, for example, between 200 and 500 nm; then, a silicon nitride deposition step is carried out to form a SiN layer 4b on the thermal oxide layer 4a, having a thickness comprised, for example, between 100 and 300 nm; finally, a TEOS layer 4c is deposited on the SiN layer 4b, with a thickness comprised, for example, between 200 and 500 nm.

When the above mentioned steps for forming the electrical-insulation layer 4 are carried out on the whole wafer 100 without any protection on the back side 2b, the electrical-insulation layer 5 is also formed on the back side 2b of the substrate 2. Consequently, the electrical-insulation layer 5 includes a thermal oxide layer 5a having a thickness comprised, for example, between 200 and 500 nm; a SiN layer 5b on the thermal oxide layer 5a, having a thickness comprised, for example, between 100 and 300 nm; and a TEOS layer 5c on the SiN layer 5b, with a thickness comprised, for example, between 200 and 500 nm.

The provision of a multilayer is useful to balance compressive/tensile stresses which are inevitably present between the substrate 2 and the electrical-insulation layers 4 and 5.

According to the specific materials used for the substrate and the electrical-insulation layers 4 and 5, the stress at their interface may not be an issue; in this case, the electrical-insulation layers 4 and 5 may comprise only one layer of dielectric or insulating material, or a stack formed by two layers of dielectric or insulating materials, or a stack formed by more than three layers of dielectric or insulating materials, according to the needs.

Then, FIG. 3B, a step of forming the heater 6 is carried out. This step includes the formation of a conductive layer 16 on the electrical-insulation layer 4, e.g., by sputtering a metal such as titanium and/or platinum, or any other suitable conductive material. In the embodiment of FIG. 3B, the heater 6 comprises a first conductive layer 6a of titanium, extending in direct contact with the electrical-insulation layer 4, and a second conductive layer 6b of platinum, extending in direct contact with the first conductive layer 6a of titanium. The first conductive layer 6a is used as an adhesion layer for the subsequently deposited second conductive layer 6b. To this end, the first conductive layer 6a may be of a material other than titanium, e.g., chromium or alumina, or it may be omitted if an adhesion layer is not desired.

According to an embodiment, the first conductive layer 6a has a thickness between 10 nm and 50 nm, and the second conductive layer 6b has a thickness between 150 nm and 250 nm.

After deposition, the first and second conductive layers 6a, 6b are shaped by photolithographic steps in order to form a serpentine-like heater 6 and electrical-connection paths (not shown) to be electrically contacted in order to supply, during use, electric current to the heater 6 so that heat can be generated through Joule effect.

Then, FIG. 3C, a further electrical-insulation layer 20 is formed on the heater 6 and the electrical-connection paths 18, to electrically insulate the heater 6 from the comb-finger electrodes 8, 10 formed in subsequent manufacturing steps. The electrical-insulation layer 20 is configured in such a way that heat generated by the heater 6 can be supplied to the comb-finger electrodes 8, 10 without excessive thermal loss. According to an embodiment, the electrical-insulation layer 20 is made of TEOS and has a thickness between 300 and 600 nm.

The electrical-insulation layer 20 is selectively etched in order to form a passing via (not shown) extending for the entire thickness of the electrical-insulation layer 20 to reach the electrical-connection path which is in electric contact with the heater 6.

Then, FIG. 3D, comb-finger electrodes 8, 10 are formed by forming a conductive layer 26 on the electrical-insulation layer 20 and inside the passing via formed in the previous step, thus electrically contacting the electrical-connection path to the heater 6. The conductive layer 26 is formed, e.g., by sputtering a metal such as titanium and/or platinum, or any other suitable conductive material, to a thickness of 150-300 nm, for example 200 nm. In the embodiment of FIG. 3D, the conductive layer 26 comprises a first sublayer 26a of titanium, extending in direct contact with the electrical-insulation layer 20, and a second sublayer 26b of platinum, extending in direct contact with the first sublayer 26a. The first sublayer 26a is used as an adhesion layer for the subsequently deposited second sublayer 26b. To this end, the first sublayer 26a may be of a material other than Titanium, e.g., chromium or alumina, or may be omitted if an adhesion layer is not desired.

According to an embodiment, the first sublayer 26a has a thickness between 10 nm and 50 nm, and the second sublayer 26b has a thickness between 100 nm and 250 nm.

After deposition, the first and second sublayers 26a, 26b are shaped by photolithographic steps in order to form: the interdigitated first and a second comb-finger electrodes 8, 10; electrical-connection paths coupled to the electrical terminals 8' and 10' of the first and, respectively, second comb-finger electrode 8, 10; and a conductive pad (not shown) in electrical contact with the electrical-connection path of the heater 6.

Then, FIG. 3E, the wafer 100 is selectively etched to form one or more vent holes 32 laterally to the first and a second comb-finger electrodes 8, 10. The vent holes 32 are formed by etching the electrical-insulation layers 4 and 20 for their entire thickness, reaching the front side 2a of the substrate 2.

Then, FIG. 3F, the wafer 100 is grinded from the back side to reduce its total thickness $t_{TOT}$ to about 200-400 µm. To this end, the electrical-insulation layer 5 is completely removed (if present), and the thickness of the substrate 2 is reduced from the back side 2b.

An etching step is then carried out at the back side 2b of the substrate 2, to selectively remove regions of the substrate 2 extending below the first and a second comb-finger electrodes 8, 10 and the vent holes 32, thereby forming a membrane 36 (including at least part of the heater 6, the first and a second comb-finger electrodes 8, 10 and the vent holes 32) suspended over a cavity 7.

The suspended membrane 36 has, in a top view on the XY plane, a shape which may be quadrangular, generally polygonal, oval or circular, with a maximum diameter of few hundreds of microns (e.g., 200-600 µm).

Figure 3G:
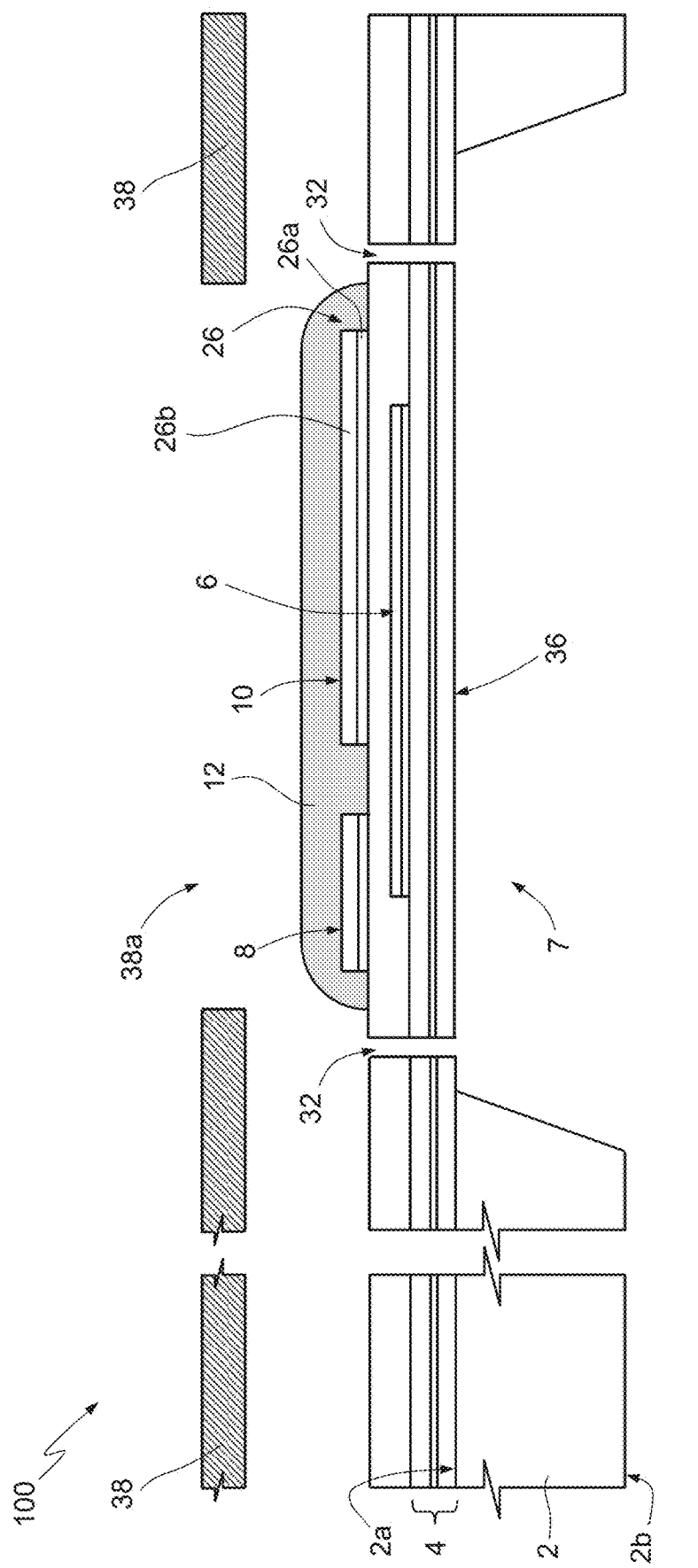

With reference to FIG. 3G, the step of forming the active layer 12 is carried out.

This process step includes the provision of a shadow mask 38 on the wafer 100. The shadow mask 38 is shaped such that it covers the wafer 100 with the exception of portions where the first and a second comb-finger electrodes 8, 10 have been formed. In particular, the shadow mask 38 covers the vent holes 32, so that they are not clogged by the subsequent step of formation of the active layer 12.

In other words, the shadow mask 38 has an aperture 38a above the first and a second comb-finger electrodes 8, 10.

The formation of the active layer 12 includes a deposition of titanium oxide ($TiO_2$) according to the process described hereunder.

Figure 3H:
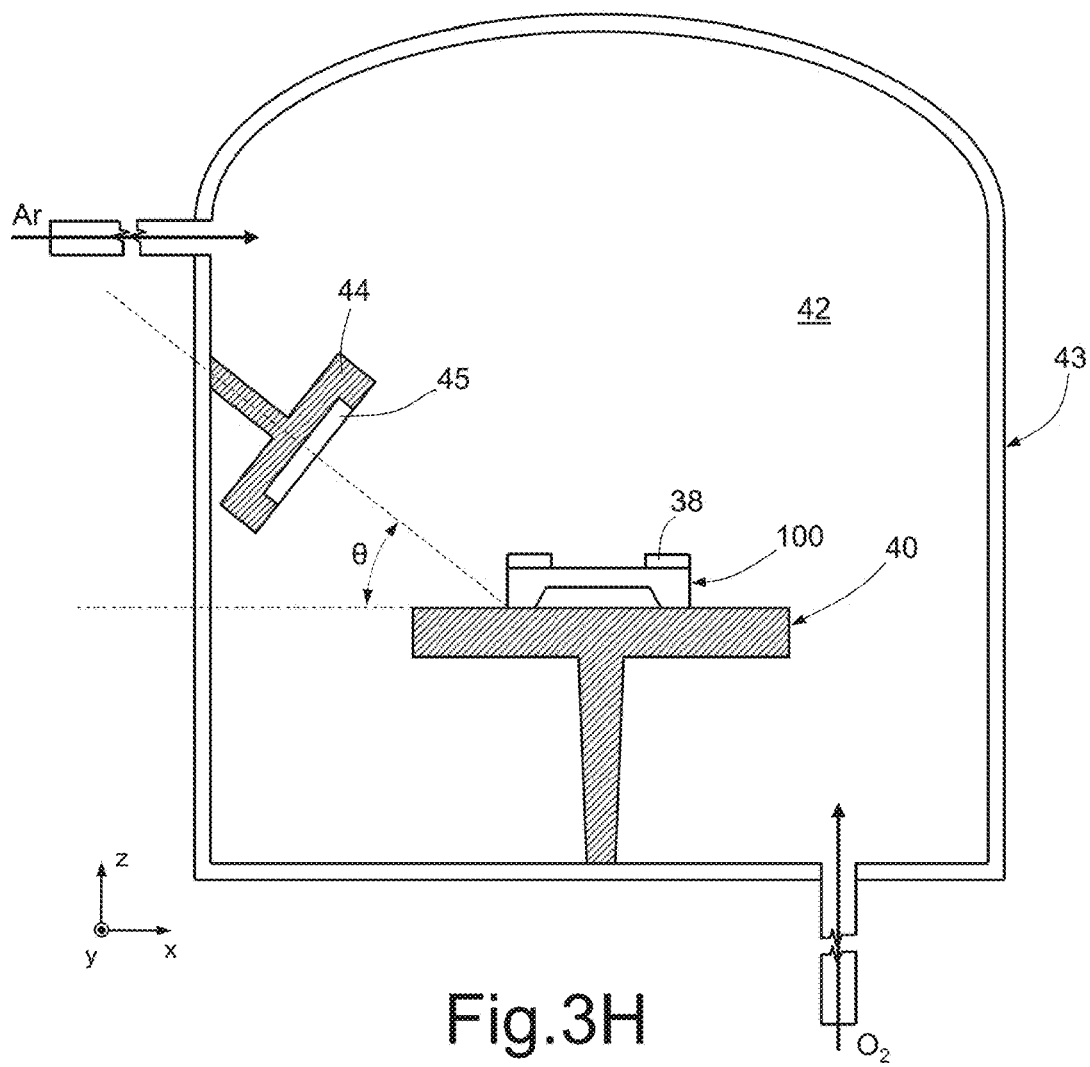

In detail, FIG. 3H, the wafer 100 provided with the shadow mask 38 is placed on a sample holder 40 of a sputtering chamber 42 of, e.g., a magnetron DC-pulsed sputtering equipment 43 (RF sputtering may be used as well). Titanium species are sputtered to the wafer 100 and deposit within the aperture 38a of the shadow mask, i.e., on, and between, the fingers of the comb-finger electrodes 8, 10.

The sputtering chamber 42 is provided with a source holder (also called "cathode") 44, provided with titanium target 45, inclined with respect to the plane of lying of the sample holder 40 of an angle θ. In the embodiment shown, the plane of lying of the sample holder 40 is parallel to the plane XY and the angle θ is the elevation angle of the source holder 44 (in particular, of the barycenter of the source holder 44) from the plane of lying (parallel to plane XY) of the sample holder 40. The angle θ is chosen between 12° and 13°, as later detailed.

A sputtering equipment 43 having a source holder 44 with the desired inclination may be easily manufactured by adapting a sputtering equipment already available.

Alternatively, instead of moving the source holder 44, it is possible to incline the sample holder 40 so that the relative angle θ between the source holder 44 and sample holder 40 is in any case obtained.

During use, the angle θ may be seen as the angle between the main direction of the sputtered atoms, flying from the target 45 to the wafer 100, and the surface (supposed to be parallel to the XY plane) of the wafer 100 where the actual deposition occurs.

The sample holder 40 and the source holder 44 are biased in a per se known way (the sample holder 40 is the anode, while the source holder 44 is the cathode). The voltage potential applied between anode and cathode is set in the range 300V-400V (power of 140 W).

The operative pressure in the sputtering chamber 42 is set by Argon flux in the range 10-11 mTorr (corresponding to about 1.33-1.47 Pa) (in particular 10.5 mTorr, corresponding to about 1.40 Pa), and the deposition temperature set in the range 22-27° C. (in particular, 25° C.). The flow rate of argon gas is chosen in the range 60-70 sccm, in particular 69 sccm.

An oxygen flux is provided to achieve oxidation of the sputtered material (here, titanium species) at the wafer level, thus generating the active layer 12 of titanium oxide. The oxygen partial pressure can be tuned in order to obtain stoichiometric $TiO_2$ layers. The flow rate of oxygen gas is chosen in the range 2-4 sccm, in particular 2 sccm.

The oxygen flux is provided from the bottom of the sputtering chamber 42 (i.e., at a height lower than that of the wafer 100), or, generally, from an inlet pipe which is closer to the wafer 100 than to the target 45. This is to avoid, or reduce, undesired oxidation of the titanium target 45 which may considerably impair the sputtering rate.

Furthermore, the oxygen source may be independent from the Ar source, so that the two fluxes can be modulated independently.

Optionally, the $TiO_2$ deposition process is preceded by a pre-sputtering step to clean up the surface of the titanium target and to remove residual thin oxide layer.

A post-deposition thermal treatment can be carried out, e.g., at a temperature in the range 190-550° C. for a time ranging from tens of seconds (e.g., 30 s) to one hour, in a gaseous environment of 78% $N_2$:22% $O_2$.

In an embodiment of the present disclosure, Ar flow-rate is settled at 69 sccm, corresponding to a deposition pressure of 14.0 Oar (1.40 Pa). The deposition is carried out at room temperature in $O_2$ reactive ambient with an oxygen flow rate of 2 sccm; the plasma is generated in the sputtering chamber using a power of 140 W (obtained setting a current of 475 mA and a voltage of 295 V), the power loading being 6.9 W/cm$^2$ (in this context, the term "power loading" is the normalized power on the target and is obtained by dividing the total power on the target by the area of the target). The corresponding growth rate of the $TiO_2$ on the wafer 100 is 4 nm/min, able to guarantee the proper layer stoichiometry by local oxidation during growth. The anode-cathode distance can be set at 1.2 cm. Furthermore, the sample holder 40 (and so the ware 100) can be kept rotating during deposition (e.g., at 20 rpm) in order to improve the layer uniformity over the wafer surface.

Under the above detailed working conditions, a double regime is settled up into the deposition chamber: a blue plasma (metallic) in proximity of the target, and an oxidizing region confined at the wafer surface. This allows avoiding charging effects and working under stable conditions, at relatively high deposition rate.

The disclosed process allows performing a progressive local oxidation during growth, thus avoiding ex-situ treatments in oxygen ambient.

Figure 4:
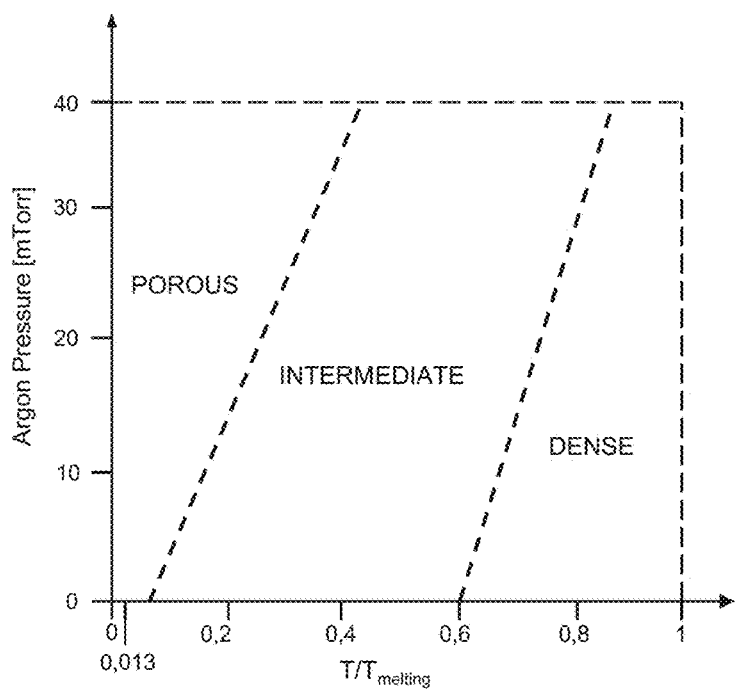
FIG. 4 is a visual representation of the porosity variation of a $TiO_2$ layer as a function of deposition parameters.

FIG. 4 shows how the porosity of the active layer 12 thus deposited varies as a function of the argon pressure inside the sputtering chamber 42 and the ratio $T/T_{melt}$, where T is the temperature of the wafer 100 (here, 25° C.) and $T_{melt}$ is the coating material melting point (here, the titanium oxide, in particular in the anatase mineral form, is the covering material with $T_{melt}$=1843° C.).

Therefore, setting a ratio $T/T_{melt}$ (here, equal to about 0.013), one can adapt the argon flux to reach the desired pressure inside the sputtering chamber 42 so that an active layer 12 of titanium oxide, having a desired porosity, can be obtained.

The previously disclosed process allows to form vertically assembled rods of titanium oxide. As already mentioned, the oxidation of the Ti species occurs locally, at the wafer side (anode), owing to the oxygen fluxing from the bottom of the chamber 42. The Applicant observed that this allows $TiO_6$ building-blocks expanding mainly along a direction perpendicular to the plane XY, from the seeds generated in-situ by the angled flux of Ti species (called "auto-seed" to notice their spontaneous generation). The auto-seeds are of oxidized titanium.

By varying the angle θ it is possible to tailor the porosity of the $TiO_2$ active layer 12.

Figure 5:
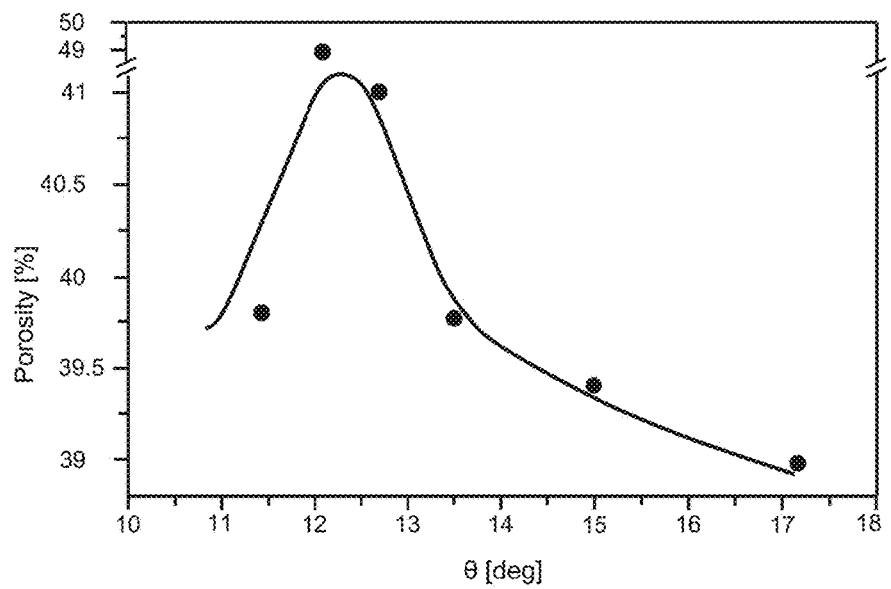
FIG. 5 is a visual representation of the porosity variation of a $TiO_2$ layer as a function of further deposition parameters.

FIG. 5 shows how the layer porosity can be tuned as a function of the angle θ. The applicant found that an angle θ between 12° and 13°, more in particular between 12° and 12.7°, even more in particular equal to 12.1°, is particularly suitable for manufacturing an active layer 12 with optimized porosity for gas sensing. Specifically, the angle of 12.1° leads to a porosity of 50% in volume, with a good distribution in terms of meso-pores and nano-pores, i.e., a distribution that provides enough contact area for the molecules/gas species to be sensed.

Additionally, the applicant verified that the process disclosed leads to an active layer 12 having good uniformity in terms of thickness and the porosity over the entire layer extension.

A further feature of the active layer 12 which is a direct consequence of the disclosed process is the dimension of the pores.

Figure 6:
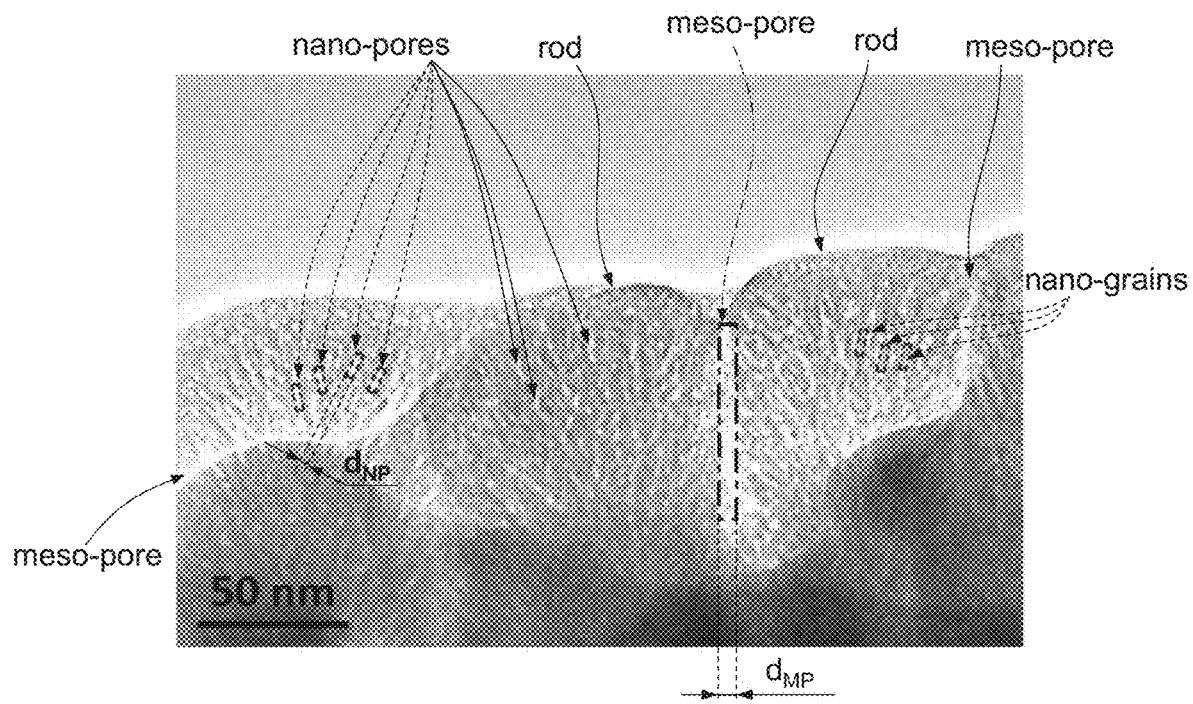
FIG. 6 is a TEM image of a gas-sensing layer of the gas sensor of FIG. 1.

The cross section in FIG. 6 is a TEM image of a $TiO_2$ layer manufactured according to the present disclosure. It can be appreciated that the $TiO_2$ layer thus manufactured is a highly porous material with a fine structure of grains and pores. The pores have meso- or nano-sizes.

The meso-pores are voids between the rods arising during growth and are potential pipelines for gas infiltration. Meso-pores have at least one dimension $d_{MP}$ in the range 6-30 nm; in particular, the dimension $d_{MP}$ is the maximum dimension of the diameter of an ideally spherical particle which can enter the meso-pore.

The rods are internally nanostructured and formed by nano-grains and nano-pores (i.e., the nano-pores are the voids between the nano-grains); the nano-pores have at least one dimension $d_{NP}$ in the range 1-5 nm. In particular, the dimension $d_{NP}$ is the maximum dimension of the diameter of an ideally spherical particle which can enter the nano-pore.

Of course, the manufacturing process may generate meso-pores whose dimension $d_{MP}$ is between 5 nm and 6 nm. In such a situation, some of the meso-pores may have one dimension $d_{MP}$ which is the same as a respective dimension $d_{NP}$ of some nano-pores.

In any case, meso-pores are large enough to be infiltrated by gas species and well fluidically interconnected to nano-pores. By virtue of this multi-branched structure, it may be referred to as sponge-like structure.

The chemical interactions between the gas species to be sensed and the active layer 12 are based on interactions between the gaseous specie and $O^-$, $O_2^-$ or $O^{2-}$ terminations of the active layer 12 (as a function of the temperature). The gaseous species reacts with said terminations to generate other gaseous molecules, such as:

$$CO_{(gas)} + O^-_{(ads)} \rightleftharpoons CO_{2(gas)} + e^-$$

In general terms, after an initial stabilization period of the material surface, the sensing mechanism is continuous, reversible and does not cause stable modifications of the active layer 12.

The advantages of the disclosure described previously, according to the various embodiments, emerge clearly from the foregoing description.

In particular, according to the present disclosure, an active layer 12 (sponge-like $TiO_2$ layer, few hundreds of nm thick) is integrated in a gas sensor architecture based on a micro-hot-plate and interdigitated comb electrodes, with the simply application of a shadow mask needed to confine the material at the active area of the device. The deposition is indeed the last fabrication step and can be done at room temperature, with practically no interferences over the pre-existing components (e.g., those who would certainly suffer from additional thermal budgets).

The choice of the $TiO_2$ layer thickness relates to the specific morphology of the interdigitated metallic fingers, with regards to their height (e.g., 200 nm); nonetheless, if needed, it can be scaled-up to fit different combs geometries. During deposition, the $TiO_2$ layer spans along and in between the metallic fingers array such that they are able to collect the current generated during interaction with the gas species.

The present disclosure, since it involves a thin active layer for sensing, allows to reduce materials waste and costs.

The $TiO_2$ active layer integration is extremely easy and, in principle, implementable over any device architecture.

During operation, the $TiO_2$ layer is locally heated over the free-standing micro-hot-plate which sets the working conditions.

The high surface to volume ratio, the high surface reactivity, the pervasive network of voids and the interconnected $TiO_2$ nano-branches offered by the spongy $TiO_2$ layer allow getting a high sensitivity, practically not affected by relative Humidity higher than 20%".

Demonstrating high performances in sensing devices using extremely scaled thickness integrated by a simple procedure represents an important step forward both in terms of materials saving and in terms of industrial benefits.

Finally, it is clear that modifications and variations may be made to what has been described and illustrated herein, without thereby departing from the scope of the present disclosure.

In particular, the present disclosure is also effective in detecting further gas species bearing an —OH anchoring group.

Furthermore, it is apparent that materials other than silicon can be used for the substrate 2, for example germanium (Ge), silicon carbide (SiC), gallium nitride (GaN), silicon germanium (SiGe), or other materials typically used in manufacturing microelectromechanical systems (MEMS).

Finally, the electrodes 8 and 10 may have any shape, other than the comb-like shape described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gas sensor for sensing a gas species in an environment, comprising:
    a substrate of semiconductor material;
    a first working electrode over the substrate;
    a second working electrode over the substrate, at a distance from the first working electrode;
    an interconnection layer extending in electrical contact with the first and the second working electrodes, configured to change its conductivity when reacting with the gas species, wherein the interconnection layer is of titanium oxide, has a porosity between 40% and 60% in volume and includes:
        a plurality of meso-pores in fluidic connection with the environment to receive the gas species and having at least one dimension in the range 5-30 nm, and
        a plurality of nano-pores, having at least one dimension in the range 1-5 nm, the plurality of nano-pores being fluidly connected to the plurality of meso-pores.

2. The gas sensor according to claim 1, wherein the interconnection layer has a thickness in the range 200-1000 nm.

3. The gas sensor according to claim 1, wherein the interconnection layer has a porosity of about 50% in volume.

4. The gas sensor according to claim 1, wherein the interconnection layer has a sponge-like structure that includes rods separated by said meso-pores, the rods having an internal structure including an interconnected network of said nano-pores.

5. The gas sensor according to claim 1, wherein the interconnection layer is such that its conductivity varies as a function of a concentration of the gas species, so that an electrical resistance between first and second working electrodes changes correspondingly.

6. The gas sensor according to claim 1, wherein the first and the second working electrodes have an interdigitated comb-like shape.

7. The gas sensor according to claim 1, wherein the first and the second working electrodes are multilayers, each of them including a first sublayer of titanium extending below a second sublayer of platinum.

8. The gas sensor according to claim 1, further comprising:
    a hot-plate, suspended over a cavity in the substrate, the first and the second working electrodes extending on the hot-plate.

9. The gas sensor according to claim 8, wherein the hot-plate includes a membrane of electrically-insulating material suspended over the cavity and a heater integrated in the membrane.

10. The gas sensor according to claim 8, wherein the heater is of a conductive material configured to generate heat by Joule effect.

11. The gas sensor according to claim 1, wherein the interconnection layer is configured to change its conductivity when reacting said gas species that is a volatile organic compound selected from the group consisting of $NH_3$, $H_2O$, CO, $H_2$, $SO_2$, $NO_2$, $CH_2O$.

12. A method, comprising:
    manufacturing a gas sensor for sensing gas species in an environment, the manufacturing including:
        forming a first working electrode over a substrate;
        forming a second working electrode over the substrate, at a distance from the first working electrode;
        forming an interconnection layer in electrical contact with the first and the second working electrodes, the interconnection layer being of a material configured to change its conductivity when reacting with said gas species, wherein forming the interconnection layer comprises depositing titanium oxide with a porosity between 40% and 60% in volume, the interconnection layer including a plurality of meso-pores and nano-pores, the meso-pores being in fluidic connection with an environment to receive the gas species and having at least one dimension in the range 5-30 nm, and being fluidically connected to the nano-pores which have at least one dimension in the range 1-5 nm.

13. The method according to claim 12, wherein forming the interconnection layer includes sputtering titanium and performing an oxidation of the titanium in a proximity of the first and second working electrodes.

14. The method according to claim 12, wherein the interconnection layer has a porosity of about 50% in volume.

15. The method according to claim 12, wherein forming the interconnection layer includes forming a sponge-like structure with rods separated by said meso-pores, the rods having an internal structure of an interconnected network of said nano-pores.

16. The method according to claim 12, wherein forming the interconnection layer further includes, after forming the first and the second working electrodes on the substrate, the steps of:
placing the substrate on a sample holder of a sputtering chamber of a sputtering equipment;
sputtering titanium species from a titanium target supported by a target holder arranged at an angle with respect to the sample holder, said angle being in the range 12°-13°.

17. The method according to claim 16, wherein said angle is 12.1°.

18. The method according to claim 16, wherein said angle is an elevation angle of the target holder above a plane of the sample holder.

19. The method according to claim 16, wherein the sample holder is an anode of the sputtering equipment and the target holder is a cathode of the sputtering equipment, the method further including applying a voltage potential in the range 300 V-400 V between the anode and cathode.

20. The method according to claim 16, wherein forming the interconnection layer further includes supplying, in the sputtering chamber, an inert gas and a reaction gas from respective inlets, the substrate and the inlet supplying the reaction gas having relative positions such that oxidation of the sputtered species occurs preferentially in a proximity of the first and second working electrodes.

21. The method according to claim 20, wherein the inert gas is argon with a flow rate in the range 60-70 sccm and the reaction gas is oxygen with a flow rate in the range 2-4 sccm.

22. The method according to claim 12, wherein forming the interconnection layer further includes setting, in the sputtering chamber during formation of the interconnection layer, a pressure in the range 10-11 mTorr and a temperature in the range 22-27° C.

23. The method according to claim 12, further including, after forming the interconnection layer, thermally treating the interconnection layer at a temperature in the range 190-550° C. for a time ranging from 30 seconds to one hour in a gaseous environment of 78% $N_2$:22% $O_2$.

24. The method according to claim 12, further comprising:
etching the substrate to form a cavity;
forming a hot-plate suspended over the cavity;
forming the first and the second working electrodes over the hot-plate.

25. The method according to claim 24, wherein forming the hot-plate includes integrating a heater in an electrically-insulating material.

26. A gas sensor for sensing a gas species in an environment, comprising:
a substrate;
a first working electrode on the substrate;
a second working electrode on the substrate, at a distance from the first working electrode;
an interconnection layer extending in contact with the first and the second working electrodes, configured to change its conductivity when reacting with the gas species, wherein the interconnection layer is of titanium oxide, has a porosity between 40% and 60% in volume and includes:
a plurality of meso-pores configured to receive the gas species and having at least one dimension in the range 5-30 nm, and
a plurality of nano-pores, having at least one dimension in the range 1-5 nm, the plurality of nano-pores being fluidly connected to the plurality of meso-pores.

* * * * *